United States Patent [19]

Hartmann et al.

[11] 4,355,093

[45] Oct. 19, 1982

[54] LAMINATE USEFUL FOR THE PRODUCTION OF PRINTING PLATES AND RELIEF PLATES

[75] Inventors: Heinrich Hartmann, Limburgerhof; Gerhard Hoffmann, Otterstadt; Werner Lenz, Bad Durkheim; John Lynch, Monsheim; Herbert Naarmann, Wattenheim, all of Fed. Rep. of Germany

[73] Assignee: BASF Aktiengesellschaft, Fed. Rep. of Germany

[21] Appl. No.: 249,707

[22] Filed: Mar. 31, 1981

[30] Foreign Application Priority Data

Apr. 22, 1980 [DE] Fed. Rep. of Germany ....... 3015419

[51] Int. Cl.³ .............................................. G03C 1/68
[52] U.S. Cl. .................................... 430/275; 430/271; 430/281; 430/300; 430/306; 430/273; 430/283; 430/288; 430/287
[58] Field of Search .............. 430/271, 281, 275, 300, 430/306, 905, 939, 523, 524

[56] References Cited

U.S. PATENT DOCUMENTS 3,654,021 4/1972 Henkler .............................. 156/331
3,877,939 4/1975 Okai ................................... 96/36.3

FOREIGN PATENT DOCUMENTS 786199 11/1957 United Kingdom .
834337 5/1960 United Kingdom .
835849 5/1960 United Kingdom .
1233883 6/1971 United Kingdom .
1351475 5/1974 United Kingdom .
1416440 12/1975 United Kingdom .

*Primary Examiner*—Jack P. Brammer
*Attorney, Agent, or Firm*—Keil & Witherspoon

[57] ABSTRACT

A laminate suitable for the production of printing plates and relief plates, and possessing a photosensitive layer, which is soluble in water or in an aqueous solution, and contains a hydrophilic polymeric binder, applied to a base, contains, between the base and the photosensitive layer, an intermediate layer which consists of a mixture of a polymeric binder which is compatible with the polymeric binder of the photosensitive layer and contains at least 30% by weight of a reaction product of a polyvinyl alcohol with acrylic anhydride and/or methacrylic anhydride, with at least one monomer which is compatible therewith and selected from the group consisting of the hydroxyalkyl acrylates and methacrylates and the diacrylates and dimethacrylates containing urethane groups. After application to the base, the intermediate layer is cured at 110°–220° C. before the photosensitive layer is applied.

4 Claims, No Drawings

LAMINATE USEFUL FOR THE PRODUCTION OF PRINTING PLATES AND RELIEF PLATES

The present invention relates to a laminate which is useful for the production of printing plates and relief plates and which exhibits improved stability on processing, especially on drying and after-exposure.

Laminates which are useful for the production of photopolymer printing plates and relief plates and can be developed with water or aqueous solutions are known per se, and a large number of such laminates have been described (cf., for example, British Pat. No. 834,337 or U.S. Pat. No. 3,877,939). On processing such water-developable photopolymer printing plates and relief plates, after-treatment of the plate, i.e. especially drying and after-exposure, causes plate defects in the form of delamination of the photopolymer layer from the base. This damage, which occurs particularly when drying is effected with infrared lamps, manifests itself in all parts of the relief, i.e. in solid and half-tone areas, and in line and dot elements. Such damage arises even under after-treatment and drying conditions which do not adequately harden the relief. This means that in order to achieve the required quality of the photopolymer layers, the after-treatment conditions would have to be made more severe in respect of temperature, drying time and radiant intensity. The damage caused by drying frequently makes the plates unusable. On the other hand, plates which are produced under milder conditions and hence without such damage cannot give good printed copies and long runs.

It is an object of the present invention to provide photopolymeric laminates which can be developed with water or with an aqueous solution and which contain one or more hydrophilic polymeric binders in the photosensitive layer, which laminates can be dried, in particular with infrared radiation, without such damage occurring, even under the more severe after-treatment conditions which are required to achieve good plate characteristics.

We have found that this object is achieved and that laminates suitable for the production of printing plates and relief plates, and possessing (a) a photosensitive layer of a mixture, soluble in water or in an aqueous solution, of
 ($a_1$) one or more hydrophilic polymeric binders, together with
 ($a_2$) one or more photopolymerizable ethylenically unsaturated monomers compatible therewith, and
 ($a_3$) a photoinitiator which can be activated by actinic light,
(b) a dimensionally stable base, and
(c) a thin intermediate layer between layers (a) and (b), which is formed from a mixture containing
 ($c_1$) one or more polymeric binders compatible with the polymeric binder ($a_1$) of layer (a), and
 ($c_2$) one or more photopolymerizable ethylenically unsaturated monomers compatible therewith, with or without ($c_3$) a photoinitiator which can be activated by actinic light, substantially show the desired properties if the polymeric binder ($c_1$) in the mixture forming the intermediate layer (c) contains at least 30% by weight, based on the binder content of the mixture (c), and preferably consists predominantly or solely, of a reaction product of a polyvinyl alcohol with acrylic anhydride and/or methacrylic anhydride, which product contains from 3 to 30% by weight of lateral acrylyl and/or methacrylyl groups, and if the mixture forming the intermediate layer (c) contains, as the monomer component ($c_2$), from 1 to 25% by weight, based on ($c_1$) plus ($c_2$), of one or more monomers selected from the group consisting of the hydroxyalkyl acrylates, where alkyl is of 2 or 3 carbon atoms, the hydroxyalkyl methacrylates, where alkyl is of 2 or 3 carbon atoms, and the monomers of the formula

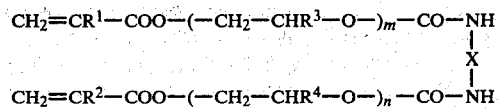

where $R^1$, $R^2$, $R^3$ and $R^4$, which may be identical or different, are each H or $C_1$–$C_8$-alkyl, X is $C_2$–$C_7$-alkylene, a divalent aromatic $C_6$–$C_{10}$ hydrocarbon radical or isophoronylene, and n and m are each integers from 1 to 4 and may be identical or different, the intermediate layer (c) being formed by applying its constituent mixture to the base (b), and then curing it at from 110° to 220° C.

The laminate possessing the novel intermediate layer, after imagewise exposure to actinic light and subsequent washout of the unexposed areas, gives printing plates and relief plates which on after-treatment show no damage due to drying.

The photosensitive layer (a) is formed from a mixture, soluble in water or in an aqueous solution, of ($a_1$) one or more hydrophilic polymeric binders, ($a_2$) one or more photopolymerizable ethylenically unsaturated monomers compatible therewith and ($a_3$) a photoinitiator; such a mixture may be, for example, one of those described in British Pat. Nos. 786,119, 834,337, 835,849, 1,233,883, 1,351,475 and 1,416,440, which are incorporated herein by reference, preferred hydrophilic polymeric binders ($a_1$) being a water-soluble polyvinyl alcohol and its water-soluble copolymers and derivatives, for example its esters, ethers and acetals. Particularly suitable monomers ($a_2$) have proved to be hydroxyl-containing acrylates and methacrylates, eg. hydroxyethyl acrylate, hydroxyethyl methacrylate, and monoacrylates, diacrylates, monomethacrylates and dimethacrylates of aliphatic glycols, eg. of ethylene glycol, butane-1,4-diol, diethylene glycol and polyethylene glycols having molecular weights of up to about 500.

Suitable polymeric binders ($c_1$) for use in the intermediate layer (c) are those which are compatible with the polymeric binder in the layer (a). Preferred binders are polyvinyl alcohol, vinyl alcohol copolymers and their water-soluble derivatives.

In the novel laminate, not less than 30% by weight and preferably more than 50% by weight of this polymeric binder ($c_1$) consists of a polyvinyl alcohol esterified with acrylic anhydride and/or methacrylic anhydride, the product possessing from 3 to 30% by weight, especially from 5 to 20% by weight, of lateral acrylyl and/or methacrylyl groups. The preparation of such reaction products is known and is described, for example, in German Pat. No. 1,065,621 and in Houben-Weyl, Methoden der organischen Chemie, 6th edition, G. Thieme-Verlag, Stuttgart 1961, Volume 14/2, pages 725 et seq. Preferred products are those prepared in a solution of the reactants. The polyvinyl alcohols used as starting materials for the reaction are preferably partially hydrolyzed polyvinyl esters, eg. polyvinyl acetates having a degree of hydrolysis of from 78 to 98% and especially from 78 to 88% and having a mean degree of polymerization of from 350 to 2,500 and especially from 400 to 2,150.

The novel laminate furthermore contains, in the mixture forming the intermediate layer (c), from 1 to 25% by weight, especially from 4 to 20% by weight, based on the sum of ($c_1$) plus ($c_2$), of one or more hydroxyalkyl acrylates and/or methacrylates, for example β-hydroxyethyl acrylate, β-hydroxypropyl acrylate or β-hydroxyethyl methacrylate and/or one or more monomers of the general formula given above. Preferably, the radicals $R^1$, $R^2$, $R^3$ and $R^4$ in this formula are hydrogen, methyl, ethyl, propyl or butyl, especially hydrogen, methyl or ethyl. X in the formula is in particular hexamethylene, toluylene or isophoronylene. Preferred monomers of the type covered by the said general formula are reaction products of 2 moles of β-hydroxyethyl acrylate or methacrylate or β-hydroxypropyl acrylate or methacrylate with 1 mole of hexamethylene diisocyanate, toluylene diisocyanate or isophorone diisocyanate, but, for example, reaction products of diethylene glycol monoacrylate or monomethacrylate or triethylene glycol monoacrylate or monomethacrylate with corresponding diisocyanates may also be used.

If a photoinitiator is added to the intermediate layer (c), its amount is from 0.1 to 10% by weight and preferably from 0.5 to 5% by weight, based on the total amount of the components of the intermediate layer (c). Any of the conventional photoinitiators may be used for this purpose.

The mixture which forms the intermediate layer (c) is applied, by conventional methods, to the dimensionally stable base (b), in an amount such that the thickness of the intermediate layer (c), after curing at from 110° to 220° C., especially at from 140° to 170° C., is advantageously from 2 to 30 μm and especially from 5 to 10 μm, the preferred curing time being from 3 to 10 minutes.

Suitable dimensionally stable bases (b) are in particular the conventional metal supports used in the production of relief plates and printing plates, such as steel or aluminum sheets; they may be pretreated in a conventional manner, either mechanically or chemically, or provided with an adhesive layer. Steel sheets which have been coated with from 10 to 40 μm, especially from 15 to 25 μm, of an adhesive as described in German Laid-Open Application DOS No. 1,597,515 are particularly suitable.

If desired, a protective cover sheet, for example consisting of polyester, may additionally be applied, in a conventional manner, over the photosensitive layer (a) of the novel laminate and, if present, can be stripped off, as appropriate, either before or after exposure of the laminate to actinic light.

In the Examples and Comparative Experiments which follow, parts and percentages are by weight, unless stated otherwise. Parts bear the same relation to parts by volume as the kilogram to the liter.

EXAMPLE 1

1.1 180 parts of a partially hydrolyzed polyvinyl acetate (degree of hydrolysis 82 mole %, average molecular weight 25,000) are suspended in 750 parts by volume of methylene chloride at room temperature and 20 parts of methacrylic anhydride are added. The inhomogeneous mixture is stirred for almost 3 hours, during which period its temperature does not rise above 50° C., and is then filtered on a suction filter. The moist reaction product which remains on the filter is then dried for 24 hours at room temperature under reduced pressure.

1.2 A 12% strength solution of a mixture of 2 parts of benzoin ethyl ether, 6 parts of the reaction product of 1 mole of toluylene diisocyanate and 2 moles of β-hydroxyethyl methacrylate and 92 parts of the polyvinyl alcohol/methacrylic anhydride reaction product, prepared as described in 1.1, in a mixture of equal parts of water and ethanol is prepared. The solution is applied to a steel sheet which has been coated with a polyurethane adhesive according to German Laid-Open Application DOS No. 1,597,515 (prepared from a commercial hydroxy-containing polyester, obtained from 2.5 moles of adipic acid, 0.5 mole of phthalic acid and 4 moles of 1,1,1-trimethylolpropane, by reaction with a triisocyanate prepared by reacting 3 moles of toluylene diisocyanate with 1 mole of 1,1,1-trimethylolpropane), the amount of solution applied to the sheet being such that, after curing for 7 minutes in a cabinet dryer at 150° C., a 10 μm thick intermediate layer (c) results.

1.3 To prepare the photosensitive layer (a), 291 parts of a partially hydrolyzed polyvinyl acetate (degree of hydrolysis 82 mole %, average molecular weight 25,000) are dissolved in 294 parts of water by stirring for several hours at 90° C. When the mixture has cooled to 70° C., a mixture of 180 parts of 2-hydroxyethyl methacrylate and 20 parts of 1,1,1-trimethylolpropane triacrylate are added, as well as 10 parts of benzil dimethylketal and 2 parts of 2,6-di-tert.-butyl-p-cresol, whilst stirring. The homogeneous, viscous solution is filtered and degassed under reduced pressure. It is then applied in a layer to a 125 μm thick polyester film (which later acts as the cover sheet), in such an amount that after 24 hours' drying at room temperature a 550 μm thick nontacky layer (a) results.

1.4 After moistening the layer (a) and the intermediate layer (c) with a water-methanol mixture, the two-layer element prepared as described in 1.3 is laminated onto the steel plate which has been provided with the intermediate layer (c) as described in 1.2, layer (a) being against layer (c); the polyester cover sheet is then stripped off.

Various samples of the resulting laminate are exposed imagewise for different periods. The unexposed areas of the layers (a) and (c) are then washed out and the resulting printing plates are dried in an after-treatment apparatus, provided with infrared heater bars, for 2.5 minutes at 90° C. (the circulating air temperature indicated by the temperature sensor in the apparatus is less than the temperature of the printing plate surface), following which they are after-exposed.

For the resulting relief plates, which have been produced with different imagewise exposure times, the minimum exposure time required to produce isolated dots 0.3 mm in diameter, isolated lines 0.15 mm in width, and a 3% highlight dot, using a 28 lines/cm screen, the relief height being 0.55 mm in each case, is determined. The minimum exposure time for the printing plates produced as described in this Example is 70 seconds.

A relief plate produced with 70 seconds' exposure time shows no damage whatsoever due to drying, and the fine elements of the relief cannot be removed with the fingers unless force is exerted.

COMPARATIVE EXPERIMENT A

The procedure described in Example 1 is followed, except that the two-layer element produced as described in Example 1.3 is laminated, with its photosensitive layer (a), onto the steel sheet, provided with an adhesive coating, which is described in Example 1.2 but this time does not carry an intermediate layer (c). The resulting laminate cannot be used to produce a printing plate, since, after a short time, the photosensitive layer (a) delaminates from the adhesive-coated steel sheet of its own accord.

COMPARATIVE EXPERIMENT B

The procedure described in Example 1 is followed, except that, to prepare the intermediate layer (c) as described in 1.2, a 12% strength solution of a mixture of 2 parts of benzoin ethyl ether, 9.8 parts of β-hydroxyethyl methacrylate and 88.2 parts of a hydrolyzed polyvinyl acetate (as used to prepare the photosensitive layer in Example 1.3) is employed. A processable printing plate is obtained; when tested as described in Example 1.4, it proves to have a minimum exposure time of 100 seconds. The relief plate obtained by exposing for 100 seconds and after-treating as described in Example 1.4 shows distinct damage caused by drying; fine elements of the relief are distorted and can be readily removed from the base with the fingers.

EXAMPLE 2

The procedure described in Example 1 is followed, except that the intermediate layer (c) consists of 35.2% of a partially hydrolyzed polyvinyl acetate having a degree of hydrolysis of 82% and a mean degree of polymerization of 500, 52.8% of a reaction product of 100 parts of this partially hydrolyzed polyvinyl acetate with 15 parts of methacrylic anhydride, 10% of a reaction product of 2 moles of β-hydroxypropyl methacrylate with 1 mole of isophorone diisocyanate and 2% of benzoin isopropyl ether. The printing plates produced with this mixture, by the method described in Example 1, require a minimum exposure time of 80 seconds and are entirely free from damage due to drying. The fine elements of the relief are well anchored on the base.

We claim:

1. A laminate suitable for the production of printing plates and relief plates, comprising
   (a) a photosensitive layer of a mixture, soluble in water or in an aqueous solution, of
   ($a_1$) at least one hydrophilic polymeric binder, together with
   ($a_2$) at least one photopolymerizable ethylenically unsaturated monomer compatible therewith, and
   ($a_3$) a photoinitiator which can be activated by actinic light,
   (b) a dimensionally stable base, and
   (c) a thin intermediate layer between layers (a) and (b), which is formed from a mixture containing
   ($c_1$) a polymeric binder which is compatible with the hydrophilic polymeric binder ($a_1$) of layer (a) and contains not less than 30% by weight, based on the total amount of binder ($c_1$), of a reaction product of a polyvinyl alcohol with acrylic anhydride and/or methacrylic anhydride, which reaction product possesses from 3 to 30%, of its weight, of lateral acrylyl and/or methacrylyl groups, and
   ($c_2$) from 1 to 25% by weight, based on the mixture of ($c_1$) plus ($c_2$), of at least one photopolymerizable ethylenically unsaturated monomer compatible with ($c_1$) and selected from the group consisting of the hydroxyalkyl acrylates, where alkyl is of 2 or 3 carbon atoms, the hydroxyalkyl methacrylates, where alkyl is of 2 or 3 carbon atoms, and the monomers of the formula

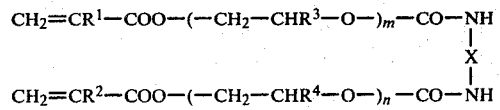

where $R^1$, $R^2$, $R^3$ and $R^4$ may be identical or different and each is H or $C_1$-$C_8$-alkyl, X is $C_2$-$C_7$-alkylene, a divalent aromatic $C_6$-$C_{10}$-hydrocarbon radical or isophoronylene, and m and n are each integers from 1 to 4 and may be identical or different, the intermediate layer being formed by applying its constituent mixture to the base (b) and then curing it at from 110° to 220° C.

2. A laminate as claimed in claim 1, wherein the monomer ($c_2$) present in the mixture which forms the intermediate layer (c) is a reaction product of 2 moles of β-hydroxyethyl acrylate or methacrylate or β-hydroxypropyl acrylate or methacrylate with 1 mole of hexamethylene diisocyanate, toluylene diisocyanate or isophorone diisocyanate.

3. A laminate as claimed in claim 1, wherein the mixture which forms the intermediate layer (c) additionally contains from 0.1 to 10% by weight, based on total mixture, of a photoinitiator.

4. A laminate as claimed in claim 1, 2 or 3, wherein the base (b) is a metal support which has been pretreated mechanically or chemically or provided with an adhesive layer.

* * * * *